(12) United States Patent
Zhang et al.

(10) Patent No.: US 12,346,640 B2
(45) Date of Patent: Jul. 1, 2025

(54) ENVIRONMENTAL SENSING METHOD BASED ON MODEL EVOLUTION

(71) Applicant: ZHEJIANG UNIVERSITY, Zhejiang (CN)

(72) Inventors: Zhaoyang Zhang, Hangzhou (CN); Yihan Zhang, Hangzhou (CN); Xin Tong, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 18/628,848

(22) Filed: Apr. 8, 2024

(65) Prior Publication Data

US 2024/0256738 A1   Aug. 1, 2024

Related U.S. Application Data

(63) Continuation of application No. PCT/CN2023/086613, filed on Apr. 6, 2023.

(30) Foreign Application Priority Data

Aug. 10, 2022  (CN) .................. 202210958277.X (51) Int. Cl.
*G06F 30/20* (2020.01)
*G01S 5/02* (2010.01)

(52) U.S. Cl.
CPC ............ *G06F 30/20* (2020.01); *G01S 5/0284* (2013.01)

(58) Field of Classification Search
None
See application file for complete search history.

(56) References Cited

U.S. PATENT DOCUMENTS

2020/0404511 A1   12/2020   Park et al.

FOREIGN PATENT DOCUMENTS

| CN | 108226864 A | 6/2018 |
|----|----|----|
| CN | 113965881 A | 1/2022 |
| CN | 114747257 A | 7/2022 |
| CN | 115462112 A | 12/2022 |
| CN | 115473771 A | 12/2022 |
| WO | 2021238887 A1 | 12/2021 |

OTHER PUBLICATIONS

International Search Report (PCT/CN2023/086613); Date of Mailing: Jul. 14, 2023.
Chinese First Office Action(202210958277.X); Date of Mailing: Dec. 18, 2024(10 pages).

*Primary Examiner* — G. Steven Vanni
(74) *Attorney, Agent, or Firm* — Wiersch Law Group (57) ABSTRACT

Provided is an environmental sensing method based on model evolution, and the method performs a channel estimation task under the current communication system to obtain channel response data, thereby realizing environmental sensing. Firstly, an interaction mechanism between electromagnetic waves and environmental objective is divided into reflection and transmission. Subsequently, a mathematical model of channel response and environmental objective is constructed, and an environmental sensing problem is modeled as a compressed sensing optimization problem. Lastly, the present disclosure initiates from a baseline model and enables iteration and evolution of the model by solving the objective to solve the compressed sensing optimization problem, ultimately achieving environmental sensing. Compared with the existing environmental sensing reconstruction methods, the environmental sensing method based on model evolution herein closely resembles real electromagnetic wave propagation characteristics and requires less prior environmental information.

3 Claims, 5 Drawing Sheets

ENVIRONMENTAL SENSING METHOD BASED ON MODEL EVOLUTION

CROSS-REFERENCE TO RELATED APPLICATIONS

The present application is a continuation of International Application No. PCT/CN2023/086613, filed on Apr. 6, 2023, which claims priority to Chinese Application No. 202210958277.X, filed on Aug. 10, 2022, the contents of both of which are incorporated herein by reference in their entireties.

TECHNICAL FIELD

The present disclosure relates to the technical field of wireless communication, and in particular, to an environmental sensing method based on model evolution.

BACKGROUND

Integrated sensing and communication is a critical technology for the next generation of wireless communication systems, which require the ability to sense the physical world, including but not limited to user position, motion speed, and human posture, while completing normal communication. The integrated sensing and communication can achieve both sensing and communication in a system, and thus achieving intensive resource utilization. Furthermore, the sensing and communication results can collaborate with each other to improve the overall performance of the system. Therefore, the integrated sensing and communication is a critical enabling technology for emerging applications such as autonomous driving, non-destructive examination, and smart cities.

By using channel Response Data, further known as Channel State Information (CSI), derived from conventional communication processes, integrated sensing and communication can be achieved without significant modifications to hardware structure and software algorithms of existing communication system, which is an extremely important critical technology. Imaging environmental objectives is the most important task among many sensing tasks and objectives, because the largest and most original amount of information about the objectives can be obtained through imaging. Various other tasks can be developed and implemented based on the information, such as object identification. Meanwhile, the imaging task requires an efficient and accurate model to describe the interaction between the target object and electromagnetic waves, as well as effective algorithms to achieve imaging of the objectives, and thus the imaging task is the most difficult sensing task.

The propagation rules of electromagnetic waves, especially the interaction between electromagnetic waves and obstacles, are quite complex. When encountering obstacles, the energy of electromagnetic waves is divided into multiple parts, including the reflected energy, the lost heat energy, and the transmitted energy: a part of the energy is reflected back into the space, while the other part propagates into the object. A part of the energy of the latter is absorbed by the object and converted into thermal energy, while the other part eventually passes through the target object, which is further known as transmission. The object of imaging is to reverse solve the environmental objectives based on the received channel state information. One of the main difficulties is the mutual influence between the environmental objectives, for example, the electromagnetic waves propagating to objective B has weak energy due to being obstructed by objective A in the middle, which is the coupling between objective A and objective B. The environment objectives are numerous and thus may have extremely complex coupling relationships, resulting in non-linear characteristics of the problems being solved and thereby sharply increasing the difficulty of solving. For current environmental sensing algorithms, the coupling relationships between the environmental objectives have not been fully studied, resulting in poor performance when solving imaging problems under real electromagnetic wave propagation characteristics.

In conclusion, comprehensively considering the environmental sensing problem and the real electromagnetic wave propagation model, a research, requires less prior information, on imaging of environmental objectives presents a highly challenging endeavor with significant practical significance.

SUMMARY

In view of the defects of the prior art, and considering the complex coupling relationships between environmental objectives under the real electromagnetic wave propagation model, the present disclosure provides an environmental sensing method based on model evolution. The environmental sensing method based on model evolution periodically performs a channel estimation task based on a communication system to obtain channel response data, thereby realizing environmental sensing, and integrated sensing and communication without significant modification to hardware or software of an existing communication system, thereby solving the problem of how to achieve environmental sensing at a base station under the real electromagnetic wave propagation model.

The object of the present disclosure is achieved by the following technical solutions:

An environmental sensing method based on model evolution, including the following steps:

step S1, receiving, by a base station, a pilot sequence signal sent by all active users in a certain space periodically, and performing channel estimation on the pilot sequence signal to obtain channel response data;

step S2, establishing, via an electromagnetic wave propagation mechanism and an occlusion effect calculation method based on position relationship, a reflection and transmission channel model under occlusion effect;

step S3, discretizing an environmental space, constructing a mathematical model of channel response and environmental objective in association with the reflection and transmission channel model obtained in the step S2, and transforming an environmental sensing problem into a generalized compressed sensing optimization problem using the mathematical model of channel response and environmental objective; and step S4, evolving a model based on the mathematical model of channel response and environmental objective obtained in the step S3 using the channel response data obtained in the step S1, and solving the generalized compressed sensing optimization problem using an evolved model and the channel response data obtained in the step S1 to achieve sensing of an environmental objective.

Further, when performing channel estimation on the pilot sequence signal using the base station in said step S1, an absolute position of a client or a relative position, relative to the base station, of the client is uploaded to the base station.

Further, said step S2 further includes the following sub-steps:

sub-step S21, calculating, via the electromagnetic wave propagation mechanism, an ideal non-line-of-sight channel response $H_{m_u,m_k,m_r,n}^{NLOS}$ from a $m_u$-th user to a $m_k$-th antenna of the base station through a n-th scatterer, in a frequency band of a $m_r$-th carrier, as follows:

$$H_{m_u,m_k,m_r,n}^{NLOS} = \alpha_{m_u,m_k,m_r,n}^{NLOS} e^{-j\varphi_{m_u,m_k,m_r,n}^{NLOS}}$$

where e represents a natural constant, j represents an imaginary unit, $\alpha_{m_u,m_k,m_r,n}^{NLOS}$ represents an amplitude of a channel, and $\varphi_{m_u,m_k,m_r,n}^{NLOS}$ represents a phase of the channel;

$$\alpha_{m_u,m_k,m_r,n}^{NLOS} = \lambda_{m_r}\sqrt{\sigma}/\left((4\pi)^{\frac{3}{2}} d_{m_u,n} d_{m_k,n}\right)$$

$$\varphi_{m_u,m_k,m_r,n}^{NLOS} = 2\pi(d_{m_u,n} + d_{m_k,n})/\lambda_{m_r}$$

where $\lambda_m$ represents a wavelength of the $m_r$-th carrier, $d_{m_u,n}$ represents a distance from the $m_u$-th user to the n-th scatterer, $d_{m_k,n}$ represents a distance from the $m_k$-th antenna of the base station to the n-th scatterer, and σ represents a radar reflection cross-sectional area of the scatterer;

sub-step S22, modeling an approximate linear propagation characteristic of a high-frequency electromagnetic wave using the occlusion effect, proposing the occlusion effect calculation method based on a location distribution of a user terminal, the base station, and the scatterer; and determining, when point $O_A$ and point $O_C$ are general points, and point $O_B$ represents an obstacle, whether the point $O_B$ obstructs a direct path between the point $O_A$ and the point $O_C$ in accordance with the following two criteria:

when a distance d from the point $O_B$ to a line connecting the point $O_A$ and the point $O_C$ is less than a threshold γ:

$$d = \frac{|\overrightarrow{O_AO_B} \times \overrightarrow{O_AO_C}|}{|\overrightarrow{O_AO_C}|} < \gamma$$

when the point $O_B$ is between the point $O_A$ and the point $O_C$:

$$0 < \overrightarrow{O_AO_C} \cdot \overrightarrow{O_AO_B} < |\overrightarrow{O_AO_C}|^2$$

when both of the two criteria are fulfilled, from a perspective of the point $O_A$, the point $O_C$ is occluded by the point $O_B$, and the occlusion effect calculation method is applied to all environmental objectives to obtain an occlusion effect indication matrix B:

$$B = g(x, L)$$

where x represents a reflection coefficient of the environmental objective, L represents a set of positions of all users and base stations, and g represents a calculation method function of the occlusion effect indication matrix B; and sub-step S23, calculating, considering the reflection coefficient x of the environmental objective, based on the ideal non-line-of-sight channel response $H_{m_u,m_k,m_r,n}^{NLOS}$ in the sub-step S21 and the occlusion effect calculation method based on the position relationship in the sub-step S22, a reflection channel model $H_{m_u,m_k,m_r,n}^{Re}$ under the occlusion effect satisfies:

$$H_{m_u,m_k,m_r,n}^{Re} = H_{m_u,m_k,m_r,n}^{NLOS} B_{m_u,m_k,m_r,n}^{Re} x_n$$

where $B_{m_u,m_k,m_r,n}^{Re}$ represents an occlusion effect indication matrix of a reflection channel, and $x_n$ represents a reflection coefficient of the n-th scatterer; and considering a transmission coefficient y of the environmental objective, a transmission channel model $H_{m_u,m_k,m_r,n}^{Tr}$ under the occlusion effect as follows:

$$H_{m_u,m_k,m_r,n}^{Tr} = H_{m_u,m_k,m_r,n}^{NLOS} B_{m_u,m_k,m_r,n}^{Tr} y_n$$

where $B_{m_u,m_k,m_r,n}^{Tr}$ represents an occlusion effect indication matrix of a transmission channel, and $Y_n$ represents a transmission coefficient of the n-th scatterer.

Further, said step S3 further includes the following sub-steps:

sub-step S31, discretizing the environmental space and dividing the environmental space into a plurality of small cubes. An environmental objective comprised in each of the plurality of cubes is equivalently concentrated at one point at a center of the small cubes, further referred to as point cloud division; when sizes of the environmental space to be sensed are $L_L$, $L_W$, $L_H$ and sizes of the small cubes are $l_l, l_w, l_h$, a total quantity N of point clouds in entire environment is calculated by $N = L_L/l_l \times L_W/l_l \times L_H/l_h$; $x_n$ represents a reflection coefficient of a n-th point cloud. When the n-th point cloud comprises no scatterer, the reflection coefficient of the n-th point cloud is 0, and when the point cloud comprise a scatterer, the reflection coefficient of the n-th point cloud is not equal to 0; $y_n$ represents a transmission coefficient of the n-th point cloud; and the environmental space to be sensed is represented by a N-dimensional reflection coefficient vector $x=[x_1, \ldots, x_N]^T$ and a N-dimensional transmission coefficient vector $y=[y_1, \ldots, y_N]^T$;

sub-step S32, combining the reflection coefficient vector x and transmission coefficient vector y obtained by discretizing the environmental space in the sub-step S31 with the reflection and transmission channel model obtained in the step S2 to construct the mathematical model of channel response and environmental objective as follows:

$$h = (H \square B^{Re})x + (H \square B^{Tr})y + v = A^{Re}x + A^{Tr}y + v$$

where h represents the channel response, X represents the reflection coefficient vector of an environment, y represents the transmission coefficient vector of the environment, H represents an ideal non-line-of-sight path matrix calculated according to the sub-step S31, $B^{Re}$ and $B^{Tr}$ represent occlusion effect indicator matrix calculated according to the sub-step S32, V represents a random additive white Gaussian noise, □ represents Hadamard product operation, $A^{Re}$ represents a measurement matrix of a reflection channel, and $A^{Tr}$ represents a measurement matrix of a transmission channel; and sub-step S33, transforming, based on the mathematical model of channel response and environmental objective in the sub-step S32, the environmental sensing problem into the generalized compressed sensing optimization problem as follows:

$$\min_{x,y} \|x\|_1 + \|y\|_1$$
$$\text{s.t.} \ \|h - A^{Re}x - A^{Tr}y\|_2 \le \varepsilon$$
$$A^{Re} = H\Box B^{Re}$$
$$A^{Tr} = H\Box B^{Tr}$$
$$B^{Re} = g(x, L)$$
$$B^{Tr} = g(y, L)$$

where x represents the reflection coefficient vector of the environment, y represents the transmission coefficient vector of the environment, $\|\cdot\|_1$ and $\|\cdot\|_2$ represent a first norm and a second norm of the vector, respectively, $$\min_{x,y}$$

represents a minimum value of a corresponding expression in value space of x and y, h represents the channel response, $A^{Re}$ represents the measurement matrix of the reflection channel, $A^{Tr}$ represents the measurement matrix of the transmission channel, ε represents a relaxation variable, H represents the ideal non-line-of-sight path matrix calculated in the sub-step S21, $B^{Re}$ and $B^{Tr}$ represent the occlusion effect indication matrix calculated according to the sub-step S22, g(·,·) represents an occlusion effect calculation function based on the position relationship, and L represents positions of the base station and all user terminals.

Further, said step S4 further includes the following sub-steps:

sub-step S41, expressing the channel response data obtained in the step S1 using a model evolution algorithm as a basic model as follows:

$$h = Hx + v \quad (1)$$

where h represents the channel response, x represents a reflection coefficient vector of an environment, H represents an ideal non-line-of-sight path matrix, and v represents a random additive white Gaussian noise; modeling a simple model formula (1) as a compressed sensing optimization problem as follows:

$$\min_x \|x\|_1$$
$$\text{s.t.} \ \|h - Hx\|_2 \le \varepsilon$$

where $$\min_x$$

represents a minimum value of a corresponding expression in a value space of x, and ε represents a relaxation variable; and solving the compressed sensing optimization problem using an expectation maximization-generalized approximation message passing algorithm;

sub-step S42, evolving, after obtaining a preliminary solution result $\hat{x}$ of an environmental objective x in the sub-step S41, the model to obtain an estimated occlusion effect indication matrix $\hat{B}^{Re}$ as follows:

$$\hat{B}^{Re} = (g\hat{x}, L)$$

where g(·,·) represents an occlusion effect calculation function based on the positional relationship, and L represents positions of the base station and all user terminals. Evolving the mathematical model of channel response and environmental objective as follows:

$$h = \left(H\Box\hat{B}^{Re}\right)x + v \quad (2)$$

where H represents the ideal non-line-of-sight path matrix, and v represents the random additive white Gaussian noise; and modeling a model formula (2) as a compressed sensing optimization problem as follows:

$$\min_x \|x\|_1$$
$$\text{s.t.} \ \left\|h - \hat{A}^{Re}x\right\|_2 \le \varepsilon$$
$$\hat{A}^{Re} = H\Box\hat{B}^{Re}$$
$$\hat{B}^{Re} = g(\hat{x}, L)$$

where x represents the environmental objective to be solved, $\hat{x}$ represents an estimation result in the sub-step S41, $$\min_x$$

min represents the minimum value of the corresponding expression in the value space of x, ε represents the relaxation variable, h represents the channel response data obtained in the step S1, $\hat{A}^{Re}$ represents a reflection channel measurement matrix calculated based on $\hat{x}$, H represents the ideal non-line-of-sight path matrix, $\hat{B}^{Re}$ represents an occlusion effect indication matrix calculated based on $\hat{x}$, g (·,·) represents the occlusion effect calculation function based on the position relationship, and L represents the positions of the base station and all user terminals;

sub-step S43, normalizing the reflection channel measurement matrix $\hat{A}^{Re}$ and transforming the compressed sensing optimization problem in the sub-step S42 into:

$$\min_x \|x\|_1$$
$$\text{s.t.} \ \left\|h - C^{Re}x^s\right\|_2 \le \varepsilon$$
$$\hat{A}^{Re} = H\Box\hat{B}^{Re}$$
$$\hat{B}^{Re} = g(\hat{x}, L)$$

-continued $$C^{Re} = \hat{A}^{Re} \cdot \text{diag}^{-1}(w)$$

$$x^s = \text{diag}(w) \cdot x$$

$$w_n = \|\hat{A}^{Re}_{:,n}\|_2 + \varsigma, \quad n = 1, \ldots, N$$

where x represents the environmental objective to be solved, $\hat{x}$ represents the estimation result in the sub-step S41, $$\min_x$$

represents the minimum value of the corresponding expression in the value space of x, h represents the channel response data obtained in the step S1, $C^{Re}$ represents an effective measurement matrix after normalization, $x^s$ represents an environmental reflection coefficient after normalization, ε represents the relaxation variable, $\hat{A}^{Re}$ represents the reflection channel measurement matrix calculated based on $\hat{x}$, H represents the ideal non-line-of-sight path matrix, $\hat{B}^{Re}$ represents the occlusion effect indication matrix calculated according to $\hat{x}$, $g(\cdot,\cdot)$ represents the occlusion effect calculation function based on the position relationship, L represents the positions of the base station and all user terminals, a function diag(·) represents a diagonal matrix comprising vector elements, w represents a vector comprising two norms of columns of the reflection channel measurement matrix $\hat{A}^{Re}$, symbol $\hat{A}^{Re}_{:,n}$ represents a n-th column of the reflection channel measurement matrix $\hat{A}^{Re}$, ζ represents a non-zero constant, and N represents the quantity of the point clouds in the environmental space; and solving the compressed sensing optimization problem by using the expectation maximization-generalized approximation message passing algorithm after preprocessing;

sub-step S44, after obtaining a solution result $\hat{x}$ of the environmental objective x in the sub-step S43, evolving the model to obtain estimated occlusion effect indication matrices $\hat{B}^{Re}$ and $\hat{B}^{Tr}$ as follows:

$$\hat{B}^{Re} = g(\hat{x}, L)$$

$$\hat{B}^{Tr} = g(\hat{x}, L)$$

where $g(\cdot,\cdot)$ represents the occlusion effect calculation function based on the positional relationship, and L represents the positions of the base station and all user terminals; evolving the mathematical model of channel response and environmental objective as follows:

$$h = (H \square \hat{B}^{Re})x + (H \square \hat{B}^{Tr})y + v$$

$$= \hat{A}^{Re}x + \hat{A}^{Tr}y + v$$

where x represents the reflection coefficient vector of the environment, Y represents a transmission coefficient vector of the environment, $\hat{A}^{Re}$ represents the reflection channel measurement matrix calculated based on $\hat{x}$, and v represents the random additive white Gaussian noise;

establishing an unified new model as follows, both the reflection coefficient vector x and the transmission coefficient vector y depends on an existence vector z of the scatterer in the environment:

$$h = (H \square B)z + v, \quad (3)$$

where B represents a mask matrix of the existence vector of the scatterer, calculated as follows:

$$B = B^{Re}\bar{x} + B^{Tr}\bar{y}$$

where $\bar{x}$ represents a mean value of a non-zero part of the reflection coefficient vector x and $\bar{y}$ represents a mean value of a non-zero part of the transmission coefficient vector y; and modeling a model formula (3) as an optimization problem:

$$\min_z \|z\|_1$$

$$\text{s.t.} \quad \|h - (H \square B)z\|_2 \leq \varepsilon$$

$$B = \frac{\hat{B}^{Re}}{\bar{x}} \bigg| \frac{\hat{B}^{Tr}}{\bar{y}}$$

$$\hat{B}^{Re} = g(\hat{x}, L)$$

$$\hat{B}^{Tr} = g(\hat{y}, L)$$

$$\bar{x} = \sum_{n=1, \hat{x}_n! = 0}^{N} \hat{x}_n \bigg/ \sum_{n=1, \hat{x}_n! = 0}^{N} 1$$

$$\bar{y} = \sum_{n=1, \hat{y}_n! = 0}^{N} \hat{y}_n \bigg/ \sum_{n=1, \hat{y}_n! = 0}^{N} 1$$

where z represents the existence vector of the scatterer to be solved, x represents the reflection coefficient vector to be solved, y represents the transmission coefficient vector to be solved, $$\min_z$$

represents the minimum value of the corresponding expression in the value space of z, h represents the channel response data obtained in the step S1, H represents the ideal non-line-of-sight path matrix, B represents the mask matrix of the existence vector of the scatterer, ε represents the relaxation variable, $\hat{x}$ and $\hat{y}$ represent estimated results in the sub-step S44, L represents the positions of the base station and all user terminals, $g(\cdot,\cdot)$ represents the occlusion effect calculation function based on the positional relationship, $\hat{B}^{Re}$ and $\hat{B}^{Tr}$ represent the occlusion effect indication matrices calculated by $\hat{x}$ and $\hat{y}$, respectively, $\bar{x}$ represents the mean value of the non-zero part of the reflection coefficient vector x and $\bar{y}$ represents the mean value of the non-zero part of the transmission coefficient vector y, and N represents the quantity of the point clouds in the environmental space;

sub-step S45, solving the existence vector z of the scatterer and modifying the mask matrix B by iteration with an alternating optimization algorithm, the alternating optimization algorithm includes:

when solving the existence vector z of the scatterer, fixing the mask matrix B, and using the expectation maximization-generalized approximation message passing algorithm to solve z; and when modifying the mask matrix B, fixing and calculating the existence vector z of the scatterer to obtain a reflection coefficient $\hat{x}$ and a transmission coefficient $\hat{y}$, calculating the occlusion effect indication matrices $\hat{B}^{Re}$ and $\hat{B}^{Tr}$, sequentially, and merging $\hat{B}^{Re}$ and $\hat{B}^{Tr}$, into a new mask matrix B; and sub-step S46, performing alternating optimization algorithm iteratively between the process of solving the existence vector z of the scatterer and modifying the mask matrix B. The alternating optimization algorithm has two ending conditions: when reaching a maximum number of iterations $T_{max}$ or converging below a threshold $\tau$, and completing the sensing of the environmental objective when the alternating optimization algorithm ends.

The present disclosure has the following advantages: firstly, the present disclosure establishes the reflection and transmission channel model under occlusion effect based on the electromagnetic wave propagation mechanism, and constructs the mathematical model of channel response and environmental objective. Then, the environmental sensing problem is transformed into the generalized compressed sensing optimization problem. Lastly, through the model evolution method, the present disclosure initiates from a simple baseline model and obtains necessary information of an advanced model by solving the objective, thereby achieving model iteration and evolution, addressing the compressed sensing problem, and completing the environmental objective sensing. The present disclosure achieves the characteristics of decoupling between the environmental objectives and minimal reliance on prior information by the strategy of model evolution, so as to progressively reconstruct the environment. Compared with existing environmental sensing reconstruction algorithms, the environmental sensing method based on model evolution according to the present disclosure significantly improves the accuracy of environmental objectives sensing, and provides an effective method for achieving environmental sensing in mobile communication systems. The present disclosure employed the strategy of model evolution at the base station for environmental sensing under the real electromagnetic wave propagation model, and has the advantages including minimal reliance on prior information and high accuracy in environmental sensing. The present disclosure performs a channel estimation task based on a communication system to obtain channel response data, thereby realizing environmental sensing, and integrated sensing and communication can be achieved without making significant modification to hardware or software of an existing communication system.

DESCRIPTION OF EMBODIMENTS

To better understand the technical solution of the present disclosure, a detailed description of the embodiments of the present disclosure will be provided below with reference to the drawings.

It should be understood that the described embodiments are merely a part of the embodiments of the present disclosure, not all of them. Based on the embodiments of the present disclosure, all other embodiments obtained by those skilled in the art without any creative effort fall within the protection scope of the present disclosure.

The terms used in the embodiments of the present disclosure are only for the purpose of describing particular embodiments, and are not intended to limit the present disclosure. As used in the embodiments of the present disclosure and the claims, the singular forms "a", "said" and "the" are further intended to include plural forms, unless the context clearly dictates other meanings.

Figure 1:
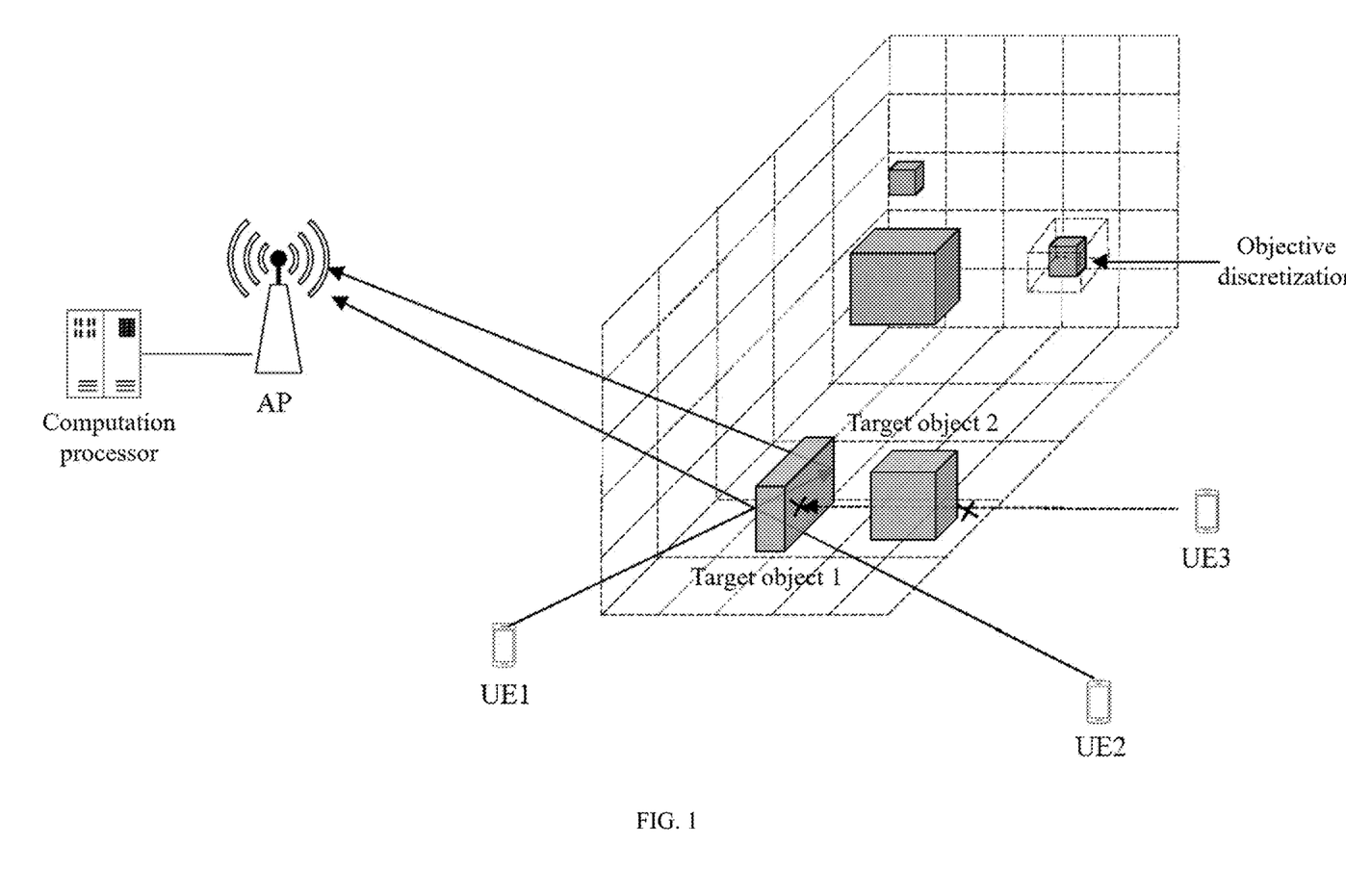
FIG. 1 shows a schematic diagram of an environmental sensing scenario based on electromagnetic wave propagation characteristics according to an exemplary embodiment.

As shown in FIG. 1, the scenario herein is an uplink communication scenario where one base station access point (AP) with multiple antenna is deployed in an outdoor area, and there are multiple active user equipment (UE) with single antenna. In the scenario, the user sends a signal to the AP, and it is assumed that the user report its location information from time to time. The AP performs a periodic channel estimation task to overcome random channel fading and obtains channel state information. These channel state information and the user's position are transmitted to a central computation processor for centralized environmental sensing.

The signal sent by the user may be affected by environmental objectives, for example, the signal sent by user 1 is reflected by target object 1 to reach the AP, and the signal sent by user 2 penetrates the target object 1 to reach the AP. The objectives in the environment further interact with each other. From the perspective of user 3, the target object 1 is obstructed due to the target object 2.

An environmental sensing method based on model evolution is provided, including:

Step S1, a pilot sequence signal sent by all active users in a certain space is received periodically by using a base station, and channel estimation is performed on the pilot sequence signal to obtain channel response data.

In one embodiment, when the channel estimation is performed on the pilot sequence signal by using the base station in the step S1, an absolute position of a client or a relative position, relative to the base station, of the client is uploaded to the base station.

Step S2, a reflection and transmission channel model under occlusion effect is established via an electromagnetic wave propagation mechanism and an occlusion effect calculation method based on position relationship.

In one embodiment, the step S2 further includes:

Sub-step S21, an ideal non-line-of-sight channel response $H_{m_u,m_k,m_r,n}^{NLOS}$ from a $m_u$-th user to a $m_k$-th antenna of the base station is calculated through a n-th scatterer, in a frequency band of a $m_r$-th carrier, as follows:

$$H_{m_u,m_k,m_r,n}^{NLOS} = \alpha_{m_u,m_k,m_r,n}^{NLOS} e^{-j\varphi_{m_u,m_k,m_r,n}^{NLOS}}$$

where e represents a natural constant, j represents an imaginary unit, $\alpha_{m_u,m_k,m_r,n}^{NLOS}$ represents an amplitude of a channel, and $\varphi_{m_u,m_k,m_r,n}^{NLOS}$ represents a phase of the channel;

$$\alpha^{NLOS}_{m_u,m_k,m_r,n} = \lambda_{m_r}\sqrt{\sigma}/\left((4\pi)^{\frac{3}{2}}d_{m_u,n}d_{m_k,n}\right)$$

$$\varphi^{NLOS}_{m_u,m_k,m_r,n} = 2\pi(d_{m_u,n} + d_{m_k,n})/\lambda_{m_r}$$

where $\lambda_{m_r}$ represents a wavelength of the $m_r$-th carrier, $d_{m_u,n}$ represents a distance from the $m_u$-th user to the n-th scatterer, $d_{m_k,n}$ represents a distance from the $m_k$-th antenna of the base station to the n-th scatterer, and $\sigma$ represents a radar reflection cross-sectional area of the scatterer.

Figure 2:
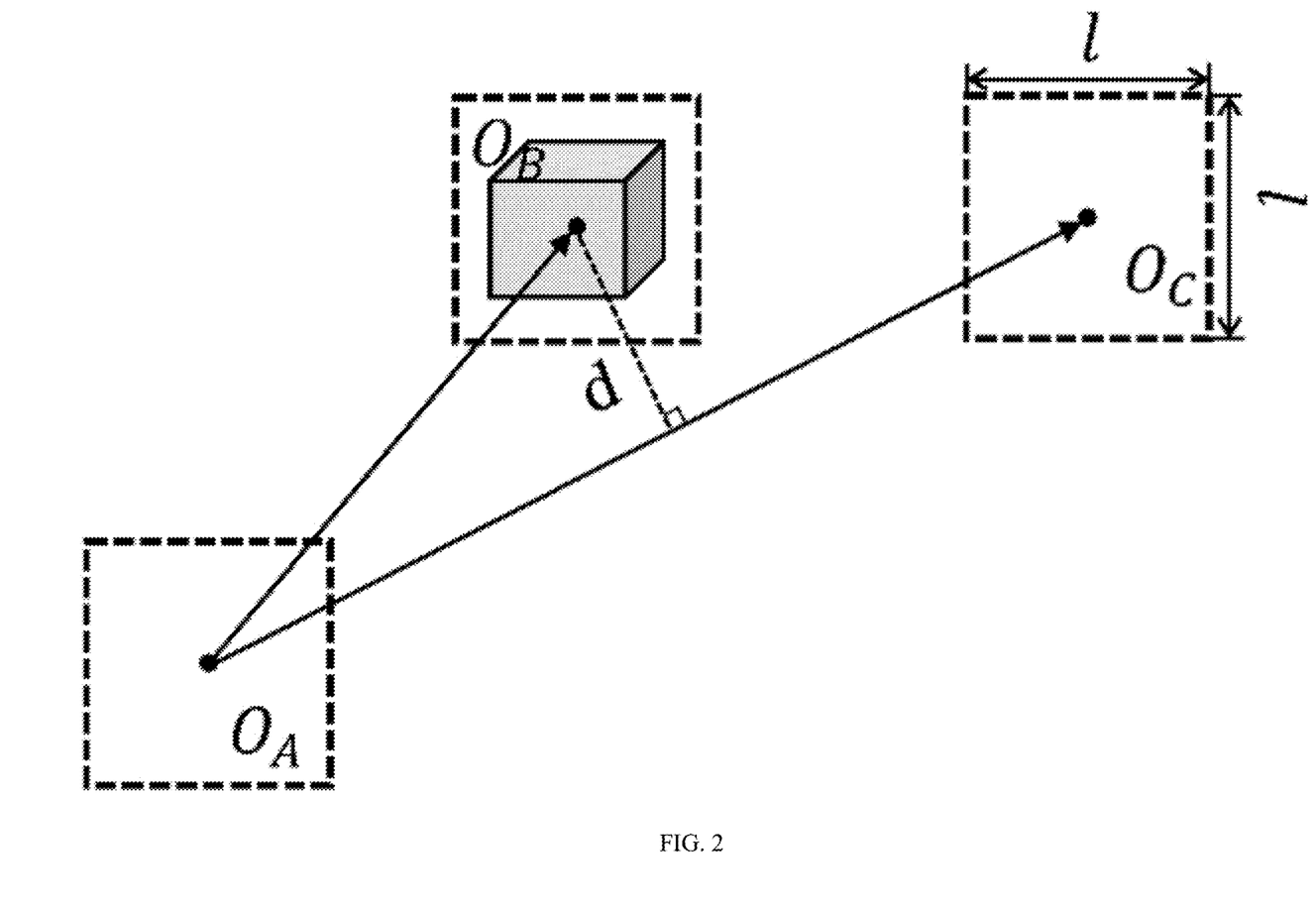
FIG. 2 shows a schematic diagram of an occlusion effect calculation method according to an exemplary embodiment.

Sub-step S22, an approximate linear propagation characteristic of a high-frequency electromagnetic wave is modeled using the occlusion effect, and the occlusion effect calculation method based on a location distribution of a user terminal, the base station, and the scatterer is proposed. As shown in FIG. 2, when point $O_A$ and point $O_C$ are general points, and point $O_B$ represents an obstacle, main criteria for determining whether the point $O_B$ obstructs the direct path between the point $O_A$ and the point $O_C$ are following two conditions:

When a distance d from the point $O_B$ to a line connecting the point $O_A$ and the point $O_C$ is less than a certain threshold $\gamma$:

$$d = \frac{|\overrightarrow{O_AO_B} \times \overrightarrow{O_AO_C}|}{|\overrightarrow{O_AO_C}|} < \gamma$$

When the point $O_B$ is between the point $O_A$ and the point $O_C$:

$$0 < \overrightarrow{O_AO_C} \cdot \overrightarrow{O_AO_B} < |\overrightarrow{O_AO_C}|^2$$

When both of the two criteria are fulfilled, from a perspective of the point $O_A$, the point $O_C$ is occluded by the point $O_B$, and the occlusion effect calculation method is applied to all environmental objectives to obtain an occlusion effect indication matrix B:

$$B = g(x, L)$$

where x represents a reflection coefficient of the environmental objective, L represents a set of positions of all users and base stations, and g represents a calculation method function of the occlusion effect indication matrix B.

Sub-step S23, considering the reflection coefficient x of the environmental objective based on the ideal non-line-of-sight channel response $H^{NLOS}_{m_u,m_k,m_r,n}$ in the sub-step S21 and the occlusion effect calculation method based on the position relationship in the sub-step S22, the reflection channel model $H^{Re}_{m_u,m_k,m_r,n}$ under the occlusion effect satisfies:

$$H^{Re}_{m_u,m_k,m_r,n} = H^{NLOS}_{m_u,m_k,m_r,n}B^{Re}_{m_u,m_k,m_r,n}x_n$$

where $B^{Re}_{m_u,m_k,m_r,n}$ represents an occlusion effect indication matrix of a reflection channel, and $x_n$ represents a reflection coefficient of the n-th scatterer. Calculating, considering a transmission coefficient y of the environmental objective, a transmission channel model $H^{Tr}_{m_u,m_k,m_r,n}$ under the occlusion effect as follows:

$$H^{Tr}_{m_u,m_k,m_r,n} = H^{NLOS}_{m_u,m_k,m_r,n}B^{Tr}_{m_u,m_k,m_r,n}y_n$$

where $B^{Tr}_{m_u,m_k,m_r,n}$ represents an occlusion effect indication matrix of a transmission channel, and $y_n$ represents a transmission coefficient of the n-th scatterer.

Step S3, an environmental space is discretized to construct a mathematical model of channel response and environmental objective in association with the reflection and transmission channel model obtained in the step S2. An environmental sensing problem is transformed into a generalized compressed sensing optimization problem using the mathematical model of channel response and environmental objective.

In one embodiment, the step S3 further includes:

Sub-step S31, the environmental space is discretized and the environmental space is divided into a plurality of small cubes. The environmental objective comprised in each of the plurality of cubes is equivalently concentrated at one point at a center of the small cubes, further referred to as point cloud division. When sizes of the environmental space to be sensed are $L_L$, $L_W$, $L_H$ and sizes of the small cubes are $l_l$,$l_w$, $l_h$, a total quantity N of point clouds in entire environment is calculated by $N = L_L/l_l \times L_W/l_w \times L_H/l_h$. A reflection coefficient of a n-th point cloud is represented by using $x_n$. When the n-th point cloud includes no scatterer, the reflection coefficient of the n-th point cloud is 0, and when the point cloud include a scatterer, the reflection coefficient of the n-th point cloud is no equal to 0. A transmission coefficient of the n-th point cloud is represented by using $y_n$. Therefore, the environmental space to be sensed is represented by the N-dimensional reflection coefficient vector $x=[x_1, \ldots, x_N]^T$ and the N-dimensional transmission coefficient vector $y=[y_1, \ldots, y_N]^T$.

Sub-step S32, the reflection coefficient vector x and transmission coefficient vector y obtained by discretizing the environmental space in the sub-step S31 is combined with the reflection and transmission channel model obtained in the step S2 to construct the mathematical model of channel response and environmental objective as follows:

$$h = (H \square B^{Re})x + (H \square B^{Tr})y + v$$
$$= A^{Re}x + A^{Tr}y + v$$

where h represents the channel response, x represents the reflection coefficient vector of an environment, y represents the transmission coefficient vector of the environment, H represents an ideal non-line-of-sight path matrix calculated according to the sub-step S31, $B^{Re}$ and $B^{Tr}$ represent occlusion effect indicator matrix calculated according to the sub-step S32, v represents a random additive white Gaussian noise, $\square$ represents Hadamard product operation, $A^{Re}$ represents a measurement matrix of a reflection channel, and $A^{Tr}$ represents a measurement matrix of a transmission channel.

Sub-step S33, based on the mathematical model of channel response and environmental objective in the sub-step S32, the environmental sensing problem is transformed into the generalized compressed sensing optimization problem as follows:

$$\min_{x,y} \|x\|_1 + \|y\|_1$$

$$\text{s.t. } \|h - A^{Re}x - A^{Tr}y\|_2 \le \varepsilon$$

$$A^{Re} = H \square B^{Re}$$

$$A^{Tr} = H \square B^{Tr}$$

$$B^{Re} = g(x, L)$$

$$B^{Tr} = g(y, L)$$

where x represents the reflection coefficient vector of the environment, y represents the transmission coefficient vector of the environment, $\|\cdot\|_1$ and $\|\cdot\|_2$ represent a first norm and a second norm of the vector, respectively, $$\min_{x,y}$$

represents a minimum value of a corresponding expression in value space of x and y, h represents the channel response, $A^{Re}$ represents the measurement matrix of the reflection channel, $A^{Tr}$ represents the measurement matrix of the transmission channel, ε represents a relaxation variable, H represents the ideal non-line-of-sight path matrix calculated in the sub-step S21, $B^{Re}$ and $B^{Tr}$ represent the occlusion effect indication matrix calculated according to the sub-step S22, g(·,·) represents an occlusion effect calculation function based on the position relationship, and L represents positions of the base station and all user terminals.

Step S4, a model is evolved based on the mathematical model of channel response and environmental objective obtained in the step S3 using the channel response data obtained in the step S1, and the generalized compressed sensing optimization problem is solved using an evolved model and the channel response data obtained in the step S1 to achieve sensing of an environmental objective.

In one embodiment, the step S4 further includes:

Sub-step S41, the channel response data obtained in the step S1 using a model evolution algorithm is expressed as a basic model as follows:

$$h = Hx + v \quad (1)$$

where h represents the channel response, x represents a reflection coefficient vector of an environment, H represents an ideal non-line-of-sight path matrix, and v represents a random additive white Gaussian noise. A simple model formula (1) is modeled as a compressed sensing optimization problem as follows:

$$\min_{x} \|x\|_1$$

$$\text{s.t. } \|h - Hx\|_2 \le \varepsilon$$

where $$\min_{x}$$

represents a minimum value of a corresponding expression in a value space of x, and ε represents a relaxation variable. An expectation maximization-generalized approximation message passing (EM-GAMP) algorithm is used for a solution of the compressed sensing optimization problem.

Sub-step S42, after a preliminary solution result $\hat{x}$ of an environmental objective x in the sub-step S41 is obtained, the model is evolved to obtain an estimated occlusion effect indication matrix $\hat{B}^{Re}$ as follows:

$$\hat{B}^{Re} = g(\hat{x}, L)$$

where g(·,·) represents an occlusion effect calculation function based on the positional relationship, and L represents positions of the base station and all user terminals. The mathematical model of channel response and environmental objective is evolved as follows:

$$h = (H \square \hat{B}^{Re})x + v \quad (2)$$

where H represents the ideal non-line-of-sight path matrix, and v represents the random additive white Gaussian noise. A model formula (2) is modeled as a compressed sensing optimization problem as follows:

$$\min_{x} \|x\|_1$$

$$\text{s.t. } \|h - \hat{A}^{Re}x\|_2 \le \varepsilon$$

$$\hat{A}^{Re} = H \square \hat{B}^{Re}$$

$$\hat{B}^{Re} = g(\hat{x}, L)$$

where x represents the environmental objective to be solved, $\hat{x}$ represents an estimation result in the sub-step S41, $$\min_{x}$$

represents the minimum value of the corresponding expression in the value space of x, ε represents the relaxation variable, h represents the channel response data obtained in the step S1, $\hat{A}^{Re}$ represents a reflection channel measurement matrix calculated based on $\hat{x}$, H represents the ideal non-line-of-sight path matrix, $\hat{B}^{Re}$ represents an occlusion effect indication matrix calculated based on $\hat{x}$, g(·,·) represents the occlusion effect calculation function based on the position relationship, and L represents the positions of the base station and all user terminals.

Sub-step S43, the reflection channel measurement matrix $\hat{A}^{Re}$ is normalized, and the compressed sensing optimization problem in the sub-step S42 is transformed into:

$$\min_{x} \|x\|_1$$

$$\text{s.t. } \|h - C^{Re}x^s\|_2 \le \varepsilon$$

$$\hat{A}^{Re} = H \square \hat{B}^{Re}$$

-continued $$\hat{B}^{Re} = g(\hat{x}, L)$$

$$C^{Re} = \hat{A}^{Re} \cdot \text{diag}^{-1}(w)$$

$$x^s = \text{diag}(w) \cdot x$$

$$w_n = \|\hat{A}^{Re}_{:,n}\|_2 + \zeta, n = 1, \ldots, N$$

where x represents the environmental objective to be solved, $\hat{x}$ represents the estimation result in the sub-step S41, $$\min_x$$

represents the minimum value of the corresponding expression in the value space of x, h represents the channel response data obtained in the step S1, $C^{Re}$ represents an effective measurement matrix after normalization, $x^s$ represents an environmental reflection coefficient after normalization, e represents the relaxation variable, $\hat{A}^{Re}$ represents the reflection channel measurement matrix calculated based on $\hat{x}$, H represents the ideal non-line-of-sight path matrix, $B^{Re}$ represents the occlusion effect indication matrix calculated according to $\hat{x}$, $g(\cdot,\cdot)$ represents the occlusion effect calculation function based on the position relationship, L represents the positions of the base station and all user terminals, a function diag($\cdot$) represents a diagonal matrix comprising vector elements, w represents a vector comprising two norms of columns of the reflection channel measurement matrix $\hat{A}^{Re}$, symbol $\hat{A}^{Re}_{:,n}$ represents a n-th column of the reflection channel measurement matrix $\hat{A}^{Re}$, $\zeta$ represents a non-zero constant, and N represents the quantity of the point clouds in the environmental space. The compressed sensing optimization problem is solved by using the expectation maximization-generalized approximation message passing (EM-GAMP) algorithm after preprocessing.

Sub-step S44, after a solution result $\hat{x}$ of the environmental objective x in the sub-step S43 is obtained, the model is evolved to obtain estimated occlusion effect indication matrices $\hat{B}^{Re}$ and $\hat{B}^{Tr}$ as follows:

$$\hat{B}^{Re} = g(\hat{x}, L)$$

$$\hat{B}^{Tr} = g(\hat{x}, L)$$

where $g(\cdot,\cdot)$ represents the occlusion effect calculation function based on the positional relationship, and L represents the positions of the base station and all user terminals. The mathematical model of channel response and environmental objective is evolved as follows:

$$h = (H \square \hat{B}^{Re})x + (H \square \hat{B}^{Tr})y + v$$

$$= \hat{A}^{Re}x + \hat{A}^{Tr}y + v$$

where x represents the reflection coefficient vector of the environment, y represents a transmission coefficient vector of the environment, $\hat{A}^{Re}$ represents the reflection channel measurement matrix calculated based on $\hat{x}$, and v represents the random additive white Gaussian noise.

Due to dependence of the reflection coefficient vector X and the transmission coefficient vector Y on an existence vector z of the scatterer in the environment, an unified new model is established:

$$h = (H \square B)z + v, \quad (3)$$

where B represents a mask matrix of the existence vector of the scatterer, calculated as follows:

$$B = B^{Re}\bar{x} + B^{Tr}\bar{y}$$

where $\bar{x}$ and $\bar{y}$ represent mean values of non-zero parts of the reflection coefficient vector x and the transmission coefficient vector Y, respectively. The model formula (3) is modeled as an optimization problem:

$$\min_z \|z\|_1$$

$$\text{s.t. } \|h - (H \square B)z\|_2 \leq \varepsilon$$

$$B = \frac{\hat{B}^{Re}}{\bar{x}} \bigg| \frac{\hat{B}^{Tr}}{\bar{y}}$$

$$\hat{B}^{Re} = g(\hat{x}, L)$$

$$\hat{B}^{Tr} = g(\hat{y}, L)$$

$$\bar{x} = \sum_{n=1,\hat{x}_n!=0}^{N} \hat{x}_n / \sum_{n=1,\hat{x}_n!=0}^{N} 1$$

$$\bar{y} = \sum_{n=1,\hat{y}_n!=0}^{N} \hat{y}_n / \sum_{n=1,\hat{y}_n!=0}^{N} 1$$

where z represents the existence vector of the scatterer to be solved, x represents the reflection coefficient vector to be solved, y represents the transmission coefficient vector to be solved, $$\min_z$$

represents the channel response data obtained in the step S1, H represents the ideal non-line-of-sight path matrix, B represents the mask matrix of the existence vector of the scatterer, e represents the relaxation variable, $\hat{x}$ and $\hat{y}$ represent estimated results in the sub-step S44, L represents the positions of the base station and all user terminals, $g(\cdot,\cdot)$ represents the occlusion effect calculation function based on the positional relationship, $\hat{B}^{Re}$ and $\hat{B}^{Tr}$ represent the occlusion effect indication matrices calculated by $\hat{x}$ and $\hat{y}$, respectively, $\bar{x}$ and $\bar{y}$ represent the mean values of the non-zero parts of the reflection coefficient vector x and the transmission coefficient vector y, respectively, and N represents the quantity of the point clouds in the environmental space.

Sub-step S45, due to complexity of the optimization problem in the sub-step S44, an alternating optimization algorithm for iteratively solving the existence vector z of the scatterer and modifying the mask matrix B is adopted to describe the alternating optimization algorithm as follows:

When solving the existence vector z of the scatterer, the mask matrix B is fixed, and the expectation maximization-generalized approximation message passing (EM-GAMP) algorithm is used to solve z.

When modifying the mask matrix B, the existence vector z of the scatterer is fixed and calculated to obtain a reflection coefficient $\hat{x}$ and a transmission coefficient $\hat{y}$. And the occlusion effect indication matrices $\hat{B}^{Re}$ and $\hat{B}^{Tr}$ are sequentially calculated, and $\hat{B}^{Re}$ and $\hat{B}^{Tr}$ are merged into a new mask matrix B.

Sub-step S46, the alternating optimization algorithm is performed between the process of iteratively solving the existence vector z of the scatterer and modifying the mask matrix B. The alternating optimization algorithm has two ending conditions: when reaching a maximum number of iterations $T_{max}$ or converging below a threshold τ, the alternating optimization algorithm ends and the sensing of the environmental objective is achieved.

Figure 3:
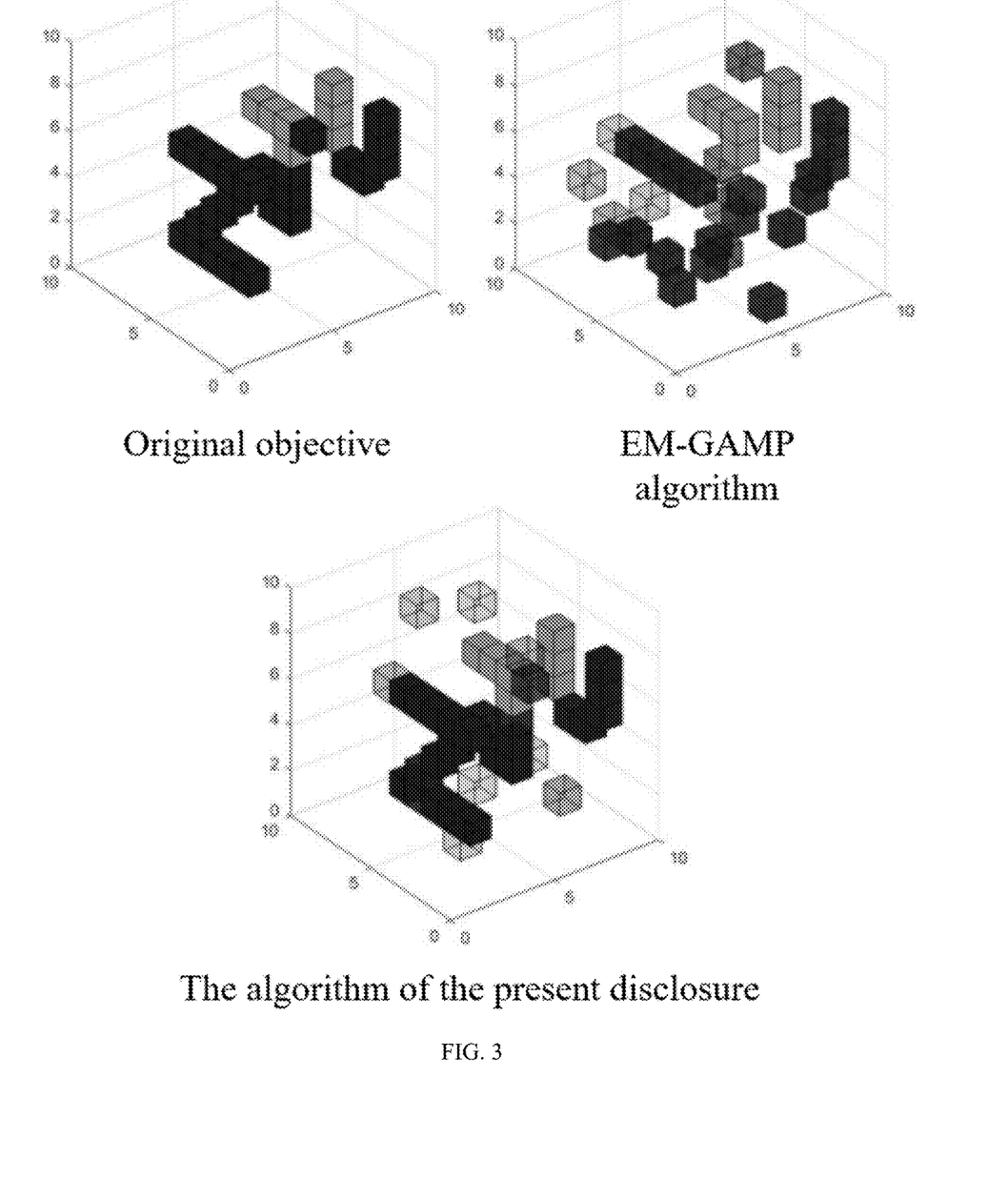
FIG. 3 shows a case display diagram of comparing the environmental objective sensing results of the algorithm of the present disclosure with other reconstruction algorithms according to an exemplary embodiment.
Figure 4:
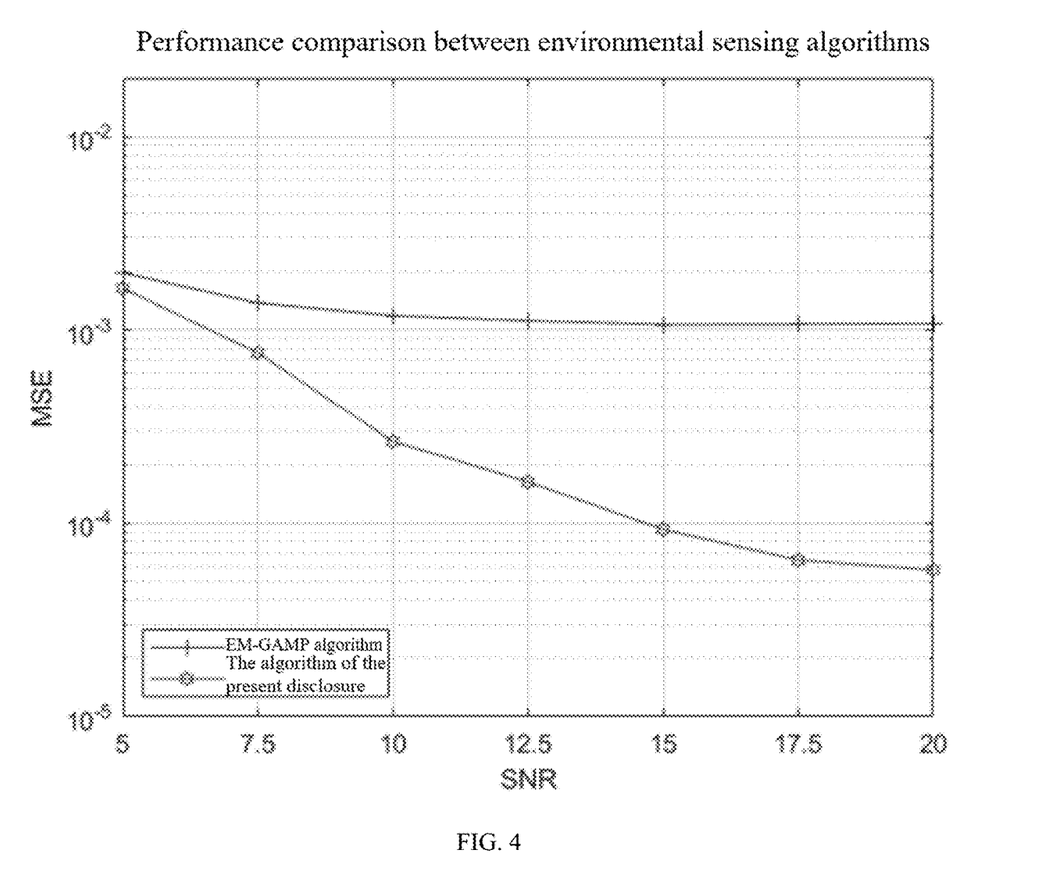
FIG. 4 shows a comparative diagram of the environmental sensing performance (MSE) of the algorithm of the present disclosure with other reconstruction algorithms under different Signal to Noise Ratio (SNR) conditions according to an exemplary embodiment.
Figure 5:
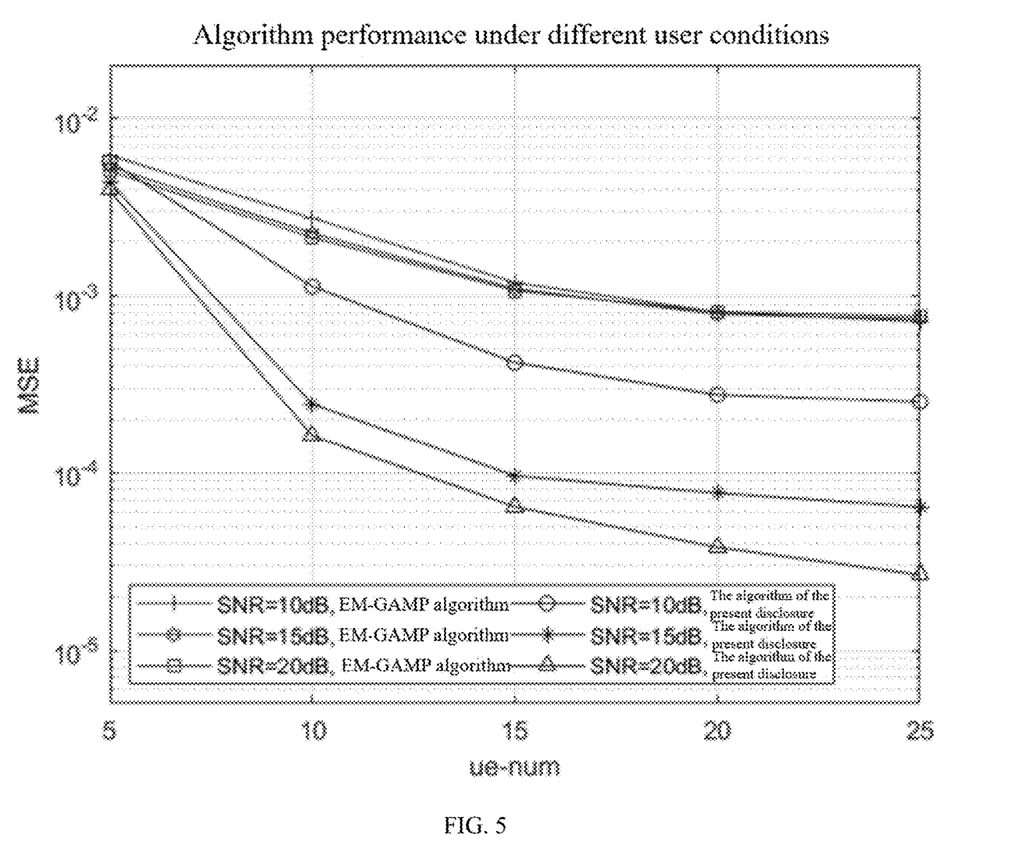
FIG. 5 shows a relationship graph between the number of the user equipment (UE) and the environmental sensing performance (MSE) when comparing the algorithm of the present disclosure with other reconstruction algorithms according to an exemplary embodiment.

Computer simulations reveal that, the EM-GAMP algorithm completely disregards the occlusion effect and the coupling relationship between target objects, resulting in poor imaging performance, as shown in FIG. 3. According to the environmental sensing method based on model evolution provided in the present disclosure, the model is iteratively corrected through calculation, and thus effectively solving the problems of occlusion effect and coupling relationship of the target objects. Compared to the EM-AGMP algorithm, the environmental sensing method based on model evolution provided in the present disclosure significantly improves the accuracy of environmental sensing. The environmental sensing performance of the method herein is significantly superior to other algorithms, and the leading advantage increases with the increase of SNR, as shown in FIG. 4. The environmental sensing performance of the method improves with the increase of the number of users, and the advantages over other algorithms are growing, as shown in FIG. 5.

In conclusion, the strategy of model evolution is employed at the base station for environmental sensing under the real electromagnetic wave propagation model, which has the advantages including minimal reliance on prior information and high accuracy in environmental sensing. The present disclosure performs a channel estimation task based on a communication system to obtain channel response data, thereby realizing environmental sensing, and integrated sensing and communication can be achieved without making significant modification to hardware or software of an existing communication system. Firstly, the present disclosure establishes the reflection and transmission channel model under occlusion effect based on the electromagnetic wave propagation mechanism, and constructs the mathematical model of channel response and environmental objective. Then, the environmental sensing problem is transformed into the generalized compressed sensing optimization problem. Lastly, through the model evolution method, the present disclosure initiates from a simple baseline model and iteratively extracts crucial information of an advanced model by solving the objective. The method enables iteration and evolution of the model, addressing the compressed sensing problem, and achieving the environmental objective sensing. The present disclosure achieves the characteristics of decoupling between the environmental objectives and minimal reliance on prior information by the strategy of model evolution, so as to progressively reconstruct the environment. Compared with existing environmental sensing reconstruction algorithms, the environmental sensing method based on model evolution according to the present disclosure significantly improves the accuracy of environmental objectives sensing, and provides an effective method for achieving environmental sensing in mobile communication systems.

The above description is only a preferred embodiment of one or more embodiments of the specification, and is not intended to limit one or more embodiments of the specification. Any modifications, equivalent replacements, improvements and the like made within the spirit and principles of one or more embodiments of the specification shall fall within the protection scope of one or more embodiments of the specification.

What is claimed is:

1. An environmental sensing method based on a model evolution algorithm, applied in a scenario where a base station perceives and images an environmental objective, comprising:

step S1, periodically receiving, by a base station, a pilot sequence signal sent by active users in a space, and performing channel estimation on the pilot sequence signal to obtain channel response data;

step S2, establishing, via an occlusion effect calculation method based on a position relationship, a reflection and transmission channel model under an occlusion effect;

step S3, discretizing an environmental space, constructing a mathematical model of a channel response and an environmental objective in association with the reflection and transmission channel model established in the step S2, and transforming an environmental sensing problem into a generalized compressed sensing optimization problem using the mathematical model of the channel response and the environmental objective; and step S4, evolving a model based on the mathematical model of the channel response and the environmental objective constructed in the step S3 using the channel response data obtained in the step S1 to obtain an evolved model, and solving the generalized compressed sensing optimization problem using the evolved model and the channel response data obtained in the step S1; and step S5, generating objective information of the environmental objective according to solution result of the generalized compressed sensing optimization problem, imaging, by the base station, of the environmental objective according to the objective information to obtain an image of the environmental objective, and transmitting the image of the environmental objective from the base station to a display device, wherein the objective information includes position information, movement speed, and attitude information;

wherein the step S2 further comprises:

sub-step S21, calculating an ideal non-line-of-sight path matrix $H_{m_u,m_k,m_r,n}^{NLOS}$ from an $m_u$-th user to an $m_k$-th antenna of the base station through an n-th scatterer, in a frequency band of an $m_r$-th carrier, as follows:

$$H_{m_u,m_k,m_r,n}^{NLOS} = \alpha_{m_u,m_k,m_r,n}^{NLOS} e^{-j\varphi_{m_u,m_k,m_r,n}^{NLOS}}$$

where e represents a natural constant, j represents an imaginary unit, $\alpha_{m_u,m_k,m_r,n}^{NLOS}$ represents an amplitude of a channel, and $\varphi_{m_u,m_k,m_r,n}^{NLOS}$ represents a phase of the channel;

$$\alpha_{m_u,m_k,m_r,n}^{NLOS} = \lambda_{m_r}\sqrt{\sigma}\Big/\big((4\pi)^{\frac{3}{2}}d_{m_u,n}d_{m_k,n}\big)$$

$$\sigma_{m_u,m_k,m_r,n}^{NLOS} = 2\pi(d_{m_u,n} + d_{m_k,n})/\lambda_{m_r}$$

where $\lambda_{m_r}$ represents a wavelength of the $m_r$-th carrier, $d_{m_u,n}$ represents a distance from the $m_u$-th user to the n-th scatterer, $d_{m_k,n}$ represents a distance from the $m_k$-th antenna of the base station to the n-th scatterer, and σ represents a radar reflection cross-sectional area of a scatterer;

sub-step S22, modeling an approximate linear propagation characteristic of an electromagnetic wave using the occlusion effect, proposing the occlusion effect calculation method based on a location distribution of a user terminal, the base station, and the scatterer; and determining, when point $O_A$ and point $O_C$ are general points, and point $O_B$ represents an obstacle, whether the point $O_B$ obstructs a direct path between the point $O_A$ and the point $O_C$ in accordance with the following two criteria:

when a distance d from the point $O_B$ to a line connecting the point $O_A$ and the point $O_C$ is less than a threshold γ:

$$d = \frac{|\overrightarrow{O_A O_B} \times \overrightarrow{O_A O_C}|}{|\overrightarrow{O_A O_C}|} < \gamma$$

when the point $O_B$ is between the point $O_A$ and the point $O_C$:

$$0 < \overrightarrow{O_A O_C} \cdot \overrightarrow{O_A O_B} < |\overrightarrow{O_A O_C}|^2$$

wherein when both of the two criteria are fulfilled, from a perspective of the point $O_A$, the point $O_C$ is occluded by the point, and the occlusion effect calculation method is applied to the environmental objective to obtain an occlusion effect indication matrix B:

$$B = g(x, L)$$

where x represents a reflection coefficient of the environmental objective, L represents a set of positions of all users and base stations, and g represents a calculation method function of the occlusion effect indication matrix B; and sub-step S23, calculating, considering the reflection coefficient x of the environmental objective, based on the ideal non-line-of-sight channel response $H_{m_u,m_k,m_r,n}^{NLOS}$ in the sub-step S21 and the occlusion effect calculation method based on the position relationship in the sub-step S22, a reflection channel model $H_{m_u,m_k,m_r,n}^{Re}$ under the occlusion effect as follows:

$$H_{m_u,m_k,m_r,n}^{Re} = H_{m_u,m_k,m_r,n}^{NLOS} B_{m_u,m_k,m_r,n}^{Re} x_n$$

where $B_{m_u,m_k,m_r,n}^{Re}$ represents an occlusion effect indication matrix of a reflection channel, and $x_n$ represents a reflection coefficient of the n-th scatterer; and calculating, considering a transmission coefficient y of the environmental objective, a transmission channel model $H_{m_u,m_k,m_r,n}^{Tr}$ under the occlusion effect as follows:

$$H_{m_u,m_k,m_r,n}^{Tr} = H_{m_u,m_k,m_r,n}^{NLOS} B_{m_u,m_k,m_r,n}^{Tr} y_n$$

where $B_{m_u,m_k,m_r,n}^{Tr}$ represents an occlusion effect indication matrix of a transmission channel, and $y_n$ represents a transmission coefficient of the n-th scatterer.

2. An environmental sensing method based on a model evolution algorithm, applied in a scenario where a base station perceives and images an environmental objective, comprising:

step S1, periodically receiving, by a base station, a pilot sequence signal sent by active users in a space, and performing channel estimation on the pilot sequence signal to obtain channel response data;

step S2, establishing, via an occlusion effect calculation method based on a position relationship, a reflection and transmission channel model under an occlusion effect;

step S3, discretizing an environmental space, constructing a mathematical model of a channel response and an environmental objective in association with the reflection and transmission channel model established in the step S2, and transforming an environmental sensing problem into a generalized compressed sensing optimization problem using the mathematical model of the channel response and the environmental objective; and step S4, evolving a model based on the mathematical model of the channel response and the environmental objective constructed in the step S3 using the channel response data obtained in the step S1 to obtain an evolved model, and solving the generalized compressed sensing optimization problem using the evolved model and the channel response data obtained in the step S1; and step S5, generating objective information of the environmental objective according to solution result of the generalized compressed sensing optimization problem, imaging, by the base station, of the environmental objective according to the objective information to obtain an image of the environmental objective, and transmitting the image of the environmental objective from the base station to a display device, wherein the objective information includes position information, movement speed, and attitude information;

wherein the step S3 further comprises:

sub-step S31, discretizing the environmental space, and dividing the environmental space into a plurality of cubes to obtain a reflection coefficient vector x and a transmission coefficient vector y, wherein the environmental objective comprised in a single cube is equivalently concentrated at one point at a center of the single cube, further referred to as point cloud division; when sizes of the environmental space are $L_L$, $L_W$, $L_H$ and sizes of the cubes are $l_l, l_w, l_h$, a total quantity N of point clouds in the environmental space is calculated by $N = L_L/l_l \times L_W/l_w \times L_H/l_h$; wherein $x_n$ represents a reflection coefficient of an n-th point cloud, when the n-th point cloud comprises no scatterer, the reflection coefficient of the n-th point cloud is 0, and when the point cloud comprise a scatterer, the reflection coefficient of the n-th point cloud is not equal to 0; wherein $y_n$ represents a transmission coefficient of the n-th point cloud; and wherein the environmental space is represented by a N-dimensional reflection coefficient vector $x = [x_1, \ldots, x_N]^T$ and a N-dimensional transmission coefficient vector $y = [y_1, \ldots, y_N]^T$;

sub-step S32, combining the reflection coefficient vector x and the transmission coefficient vector y obtained by discretizing the environmental space in the sub-step S31 with the reflection and transmission channel model established in the step S2 to construct the mathematical model of the channel response and the environmental objective as follows:

$$h = (H \square B^{Re})x + (H \square B^{Tr})y + v$$
$$= A^{Re}x + A^{Tr}y + v$$

where h represents the channel response, x represents the reflection coefficient vector, y represents the transmission coefficient vector, H represents an ideal non-line-of-sight path matrix calculated according to the sub-step S21, $B^{Re}$ and $B^{Tr}$ represent occlusion effect indicator matrixes calculated according to the sub-step S22, v represents a random additive white Gaussian noise, $\square$ represents a Hadamard product operation, $A^{Re}$ represents a measurement matrix of a reflection channel, and $A^{Tr}$ represents a measurement matrix of a transmission channel; and sub-step S33, transforming, based on the mathematical model of the channel response and the environmental objective in the sub-step S32, the environmental sensing problem into the generalized compressed sensing optimization problem as follows:

$$\min_{x,y} \|x\|_1 + \|y\|_1$$
$$\text{s.t. } \|h - A^{Re}x - A^{Tr}y\|_2 \le \varepsilon$$
$$A^{Re} = H \square B^{Re}$$
$$A^{Tr} = H \square B^{Tr}$$
$$B^{Re} = g(x, L)$$
$$B^{Tr} = g(y, L)$$

where x represents the reflection coefficient vector, y represents the transmission coefficient vector, $\|\cdot\|_1$ and $\|\cdot\|_2$ represent a first norm and a second norm of the vector, respectively, $$\min_{x,y}$$

represents a minimum value of a corresponding expression in value space of x and y, h represents the channel response, $A^{Re}$ represents the measurement matrix of the reflection channel, $A^{Tr}$ represents the measurement matrix of the transmission channel, $\varepsilon$ represents a relaxation variable, H represents the ideal non-line-of-sight path matrix calculated in the sub-step S21, $B^{Re}$ and $B^{Tr}$ represent the occlusion effect indication matrix calculated according to the sub-step S22, $g(\cdot,\cdot)$ represents an occlusion effect calculation function based on the position relationship, and L represents positions of the base station and user terminals.

3. An environmental sensing method based on a model evolution algorithm, applied in a scenario where a base station perceives and images an environmental objective, comprising:

step S1, periodically receiving, by a base station, a pilot sequence signal sent by active users in a space, and performing channel estimation on the pilot sequence signal to obtain channel response data;

step S2, establishing, via an occlusion effect calculation method based on a position relationship, a reflection and transmission channel model under an occlusion effect;

step S3, discretizing an environmental space, constructing a mathematical model of a channel response and an environmental objective in association with the reflection and transmission channel model established in the step S2, and transforming an environmental sensing problem into a generalized compressed sensing optimization problem using the mathematical model of the channel response and the environmental objective; and step S4, evolving a model based on the mathematical model of the channel response and the environmental objective constructed in the step S3 using the channel response data obtained in the step S1 to obtain an evolved model, and solving the generalized compressed sensing optimization problem using the evolved model and the channel response data obtained in the step S1; and step S5, generating objective information of the environmental objective according to solution result of the generalized compressed sensing optimization problem, imaging, by the base station, of the environmental objective according to the objective information to obtain an image of the environmental objective, and transmitting the image of the environmental objective from the base station to a display device, wherein the objective information includes position information, movement speed, and attitude information;

wherein the step S4 further comprises:

sub-step S41, expressing the channel response data obtained in the step S1 using a model evolution algorithm as a basic model, steps of the model evolution algorithm are as follows:

$$h = Hx + v \qquad (1)$$

where h represents the channel response, x represents a reflection coefficient vector, H represents an ideal non-line-of-sight path matrix, and v represents a random additive white Gaussian noise;

modeling a simple model formula (1) as a compressed sensing optimization problem as follows:

$$\min_{x} \|x\|_1$$
$$\text{s.t. } \|h - Hx\|_2 \le \varepsilon$$

where $$\min_{x}$$

represents a minimum value of a corresponding expression in a value space of x, and $\varepsilon$ represents a relaxation variable; and solving the compressed sensing optimization problem using an expectation maximization-generalized approximation message passing algorithm;

sub-step S42, evolving, after obtaining an estimation result $\hat{x}$ of an environmental objective in the sub-step S41, the model to obtain an estimated occlusion effect indication matrix $\hat{B}^{Re}$ as follows:

$$\hat{B}^{Re} = g(\hat{x}, L)$$

where $g(\cdot,\cdot)$ represents an occlusion effect calculation function based on the positional relationship, and L represents positions of the base station and user terminals;

evolving the mathematical model of the channel response and the environmental objective as follows:

$$h = (H \square \hat{B}^{Re})x + v \quad (2)$$

where H represents the ideal non-line-of-sight path matrix, and v represents the random additive white Gaussian noise; and modeling a model formula (2) as a compressed sensing optimization problem as follows:

$$\min_x \|x\|_1$$
$$\text{s.t. } \|h - \hat{A}^{Re}x\|_2 \leq \varepsilon$$
$$\hat{A}^{Re} = H \square \hat{B}^{Re}$$
$$\hat{B}^{Re} = g(\hat{x}, L)$$

where x represents the environmental objective, $\hat{x}$ represents an estimation result in the sub-step S41, $$\min_x$$

represents the minimum value of the corresponding expression in the value space of x, $\varepsilon$ represents the relaxation variable, h represents the channel response data obtained in the step S1, $\hat{A}^{Re}$ represents a reflection channel measurement matrix calculated based on $\hat{x}$, H represents the ideal non-line-of-sight path matrix, $\hat{B}^{Re}$ represents an occlusion effect indication matrix calculated based on $\hat{x}$, $g(\cdot,\cdot)$ represents the occlusion effect calculation function based on the position relationship, and L represents the positions of the base station and the user terminals;

sub-step S43, normalizing the reflection channel measurement matrix $\hat{A}^{Re}$ and transforming the compressed sensing optimization problem in the sub-step S42 into:

$$\min_x \|x\|_1$$
$$\text{s.t. } \|h - C^{Re}x^s\|_2 \leq \varepsilon$$
$$\hat{A}^{Re} = H \square \hat{B}^{Re}$$

-continued
$$\hat{B}^{Re} = g(\hat{x}, L)$$
$$C^{Re} = \hat{A}^{Re} \cdot \text{diag}^{-1}(w)$$
$$x^s = \text{diag}(w) \cdot x$$
$$w_n = \|\hat{A}^{Re}_{:,n}\|_2 + \zeta, n = 1, \ldots, N$$

where x represents the environmental objective, $\hat{x}$ represents the estimation result in the sub-step S41, $$\min_x$$

represents the minimum value of the corresponding expression in the value space of x, h represents the channel response data obtained in the step S1, $C^{Re}$ represents an effective measurement matrix after normalization, $x^s$ represents an environmental reflection coefficient after normalization, $\varepsilon$ represents the relaxation variable, $\hat{A}^{Re}$ represents the reflection channel measurement matrix calculated based on $\hat{x}$, H represents the ideal non-line-of-sight path matrix, $\hat{B}^{Re}$ represents the occlusion effect indication matrix calculated according to $\hat{x}$, $g(\cdot,\cdot)$ represents the occlusion effect calculation function based on the position relationship, L represents the positions of the base station and the user terminals, a function $\text{diag}(\cdot)$ represents a diagonal matrix comprising vector elements, w represents a vector comprising two norms of columns of the reflection channel measurement matrix $\hat{A}^{Re}$, symbol $\hat{A}^{Re}_{:,n}$ represents an n-th column of the reflection channel measurement matrix $\hat{A}^{Re}$, $\delta$ represents a non-zero constant, and N represents the quantity of point clouds in the environmental space; and solving the compressed sensing optimization problem by using the expectation maximization-generalized approximation message passing algorithm after preprocessing;

sub-step S44, after obtaining a solution result $\hat{x}$ of the environmental objective in the sub-step S43, evolving the model to obtain estimated occlusion effect indication matrices $\hat{B}^{Re}$ and $\hat{B}^{Tr}$ as follows:

$$\hat{B}^{Re} = g(\hat{x}, L)$$
$$\hat{B}^{Tr} = g(\hat{x}, L)$$

where $g(\cdot,\cdot)$ represents the occlusion effect calculation function based on the positional relationship, and L represents the positions of the base station and the user terminals;

evolving the mathematical model of the channel response and the environmental objective as follows:

$$h = (H \square \hat{B}^{Re})x + (H \square \hat{B}^{Tr})y + v$$
$$= \hat{A}^{Re}x + \hat{A}^{Tr}y + v$$

where x represents the reflection coefficient vector, y Re represents represents a transmission coefficient vector, $\hat{A}^{Re}$ represents the reflection channel measurement matrix calculated based on $\hat{x}$, and v represents the random additive white Gaussian noise;

establishing a unified new model as follows, wherein both the reflection coefficient vector x and the transmission coefficient vector y depend on an existence vector z of the scatterer in the environment:

$$h = (H \square B)z + v, \quad (3)$$

where B represents a mask matrix of the existence vector of the scatterer, calculated as follows:

$$B = B^{Re}\bar{x} + B^{Tr}\bar{y}$$

where $\bar{x}$ represents a mean value of a non-zero part of the reflection coefficient vector x and $\bar{y}$ represents a mean value of a non-zero part of the transmission coefficient vector y; and modeling a model formula (3) as an optimization problem:

$$\min_{z} \|z\|_1$$
$$\text{s.t. } \|h - (H \square B)z\|_2 \leq \varepsilon$$
$$B = \frac{\hat{B}^{Re}}{\bar{x}} \bigg| \frac{\hat{B}^{Tr}}{\bar{y}}$$
$$\hat{B}^{Re} = g(\hat{x}, L)$$
$$\hat{B}^{Tr} = g(\hat{y}, L)$$
$$\bar{x} = \sum_{n=1, \hat{x}_n! = 0}^{N} \hat{x}_n \bigg/ \sum_{n=1, \hat{x}_n! = 0}^{N} 1$$
$$\bar{y} = \sum_{n=1, \hat{y}_n! = 0}^{N} \hat{y}_n \bigg/ \sum_{n=1, \hat{y}_n! = 0}^{N} 1$$

where z represents the existence vector of the scatterer to be solved, x represents the reflection coefficient vector to be solved, y represents the transmission coefficient vector to be solved, $$\min_{z}$$

represents the minimum value of the corresponding expression in the value space of z, h represents the channel response data obtained in the step S1, H represents the ideal non-line-of-sight path matrix, B represents the mask matrix of the existence vector of the scatterer, $\varepsilon$ represents the relaxation variable, $\hat{x}$ and $\hat{y}$ represent estimated results in the sub-step S41, L represents the positions of the base station and the user terminals, $g(\cdot,\cdot)$ represents the occlusion effect calculation function based on the positional relationship, $\hat{B}^{Re}$ and $\hat{B}^{Tr}$ represent the occlusion effect indication matrices calculated by $\hat{x}$ and $\hat{y}$, respectively, $\bar{x}$ represents the mean value of the non-zero parts of the reflection coefficient vector x, and $\bar{y}$ represents the mean value of the non-zero parts of the transmission coefficient vector y, and N represents the quantity of the point clouds in the environmental space;

sub-step S45, solving the existence vector z of the scatterer and modifying the mask matrix B by iteration with an alternating optimization algorithm, wherein the alternating optimization algorithm comprises:

when solving the existence vector z of the scatterer, fixing the mask matrix B, and using the expectation maximization-generalized approximation message passing algorithm to solve z; and when modifying the mask matrix B, fixing and calculating the existence vector z of the scatterer to obtain a reflection coefficient $\hat{x}$ and a transmission coefficient $\hat{y}$, calculating the occlusion effect indication matrices $\hat{B}^{Re}$ and $\hat{B}^{Tr}$ sequentially, and merging $\hat{B}^{Re}$ and $\hat{B}^{Tr}$ into a new mask matrix B; and sub-step S46, performing the alternating optimization algorithm iteratively between a process of solving the existence vector Z of the scatterer and a process of modifying the mask matrix B, wherein the alternating optimization algorithm has two ending conditions: when reaching a maximum number of iterations $T_{max}$ or converging below a threshold $\tau$, and completing the sensing of the environmental objective when the alternating optimization algorithm ends.

* * * * *